United States Patent [19]

Hillger et al.

[11] Patent Number: 4,829,824

[45] Date of Patent: May 16, 1989

[54] METHOD FOR DIGITAL PEAK VALUE MEASUREMENT FOR ULTRASONIC TEST PULSES

[75] Inventors: Wolfgang Hillger, Braunschweig; Jürgen D. E. Klebusch, Achim, both of Fed. Rep. of Germany

[73] Assignee: Deutsche Forschungs- und Versuchsanstalt fur Luft- und Raumfahrt e.V., Koln, Fed. Rep. of Germany

[21] Appl. No.: 168,005

[22] Filed: Mar. 2, 1988

Related U.S. Application Data

[63] Continuation of Ser. No. 926,891, Oct. 31, 1986, abandoned.

[30] Foreign Application Priority Data

Nov. 2, 1985 [DE] Fed. Rep. of Germany ....... 3538948
Jul. 29, 1986 [DE] Fed. Rep. of Germany ....... 3625618

[51] Int. Cl.$^4$ .......................................... G01N 29/04
[52] U.S. Cl. ........................................ 73/614; 73/901
[58] Field of Search ................. 73/602, 610, 611, 614, 73/606, 901; 324/99 D; 367/105

[56] References Cited

U.S. PATENT DOCUMENTS

| | | | |
|---|---|---|---|
| 4,205,553 | 6/1980 | Rudis et al. | 73/611 |
| 4,210,904 | 7/1980 | Renzel et al. | 364/507 |
| 4,327,588 | 5/1982 | North | 73/602 |
| 4,432,235 | 2/1984 | Renzel et al. | 73/614 |
| 4,475,398 | 10/1984 | Tjornehoj et al. | 73/599 |
| 4,564,804 | 1/1986 | Wilke et al. | 324/103 P |

FOREIGN PATENT DOCUMENTS 1161542 1/1984 Canada .
1402495 8/1975 United Kingdom .

OTHER PUBLICATIONS

D. Bowers, "Tracking A/D Conversion", *Electronic Engineering*, Dec. 1979, pp. 37–42.

*Primary Examiner*—John Chapman
*Attorney, Agent, or Firm*—Salter & Michaelson

[57] ABSTRACT

Method for the digital peak value measurement for ultrasonic test pulses having a predetermined pulse repetition frequency. After amplification, the input signal to be measured is present at a comparator circuit the output of which is connected, within a predetermined time slot, periodically generated, for the expected signal time range, to a memory which is reset at the beginning of the time slot. The received signal is applied to a window comparator the window width of which corresponds to one voltage step of a reference voltage which is supplied by a D/A converter and which can be changed in steps. The D/A converter is controlled by a digital counter the direction of counting of which is controlled in dependence on the memory contents and which is stopped in the case of equality between the received signal within the time slot and the respective reference voltage. The display is derived from the final count. The clock signal for the digital counter has the same frequency as the time slot and is derived from it. To extend the dynamic range, the amplified signal can be applied to the window comparator with different signal levels.

8 Claims, 3 Drawing Sheets

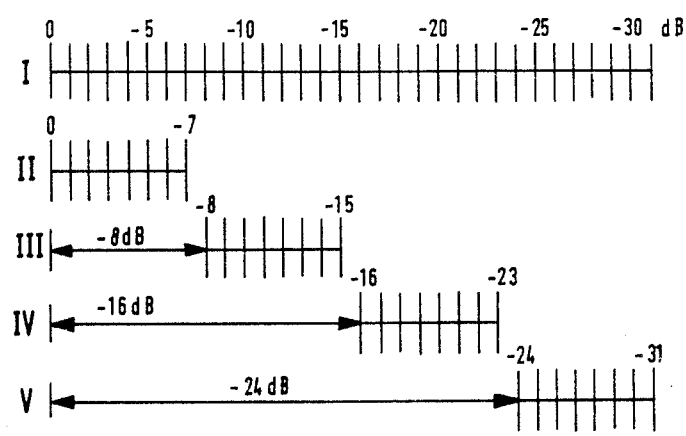
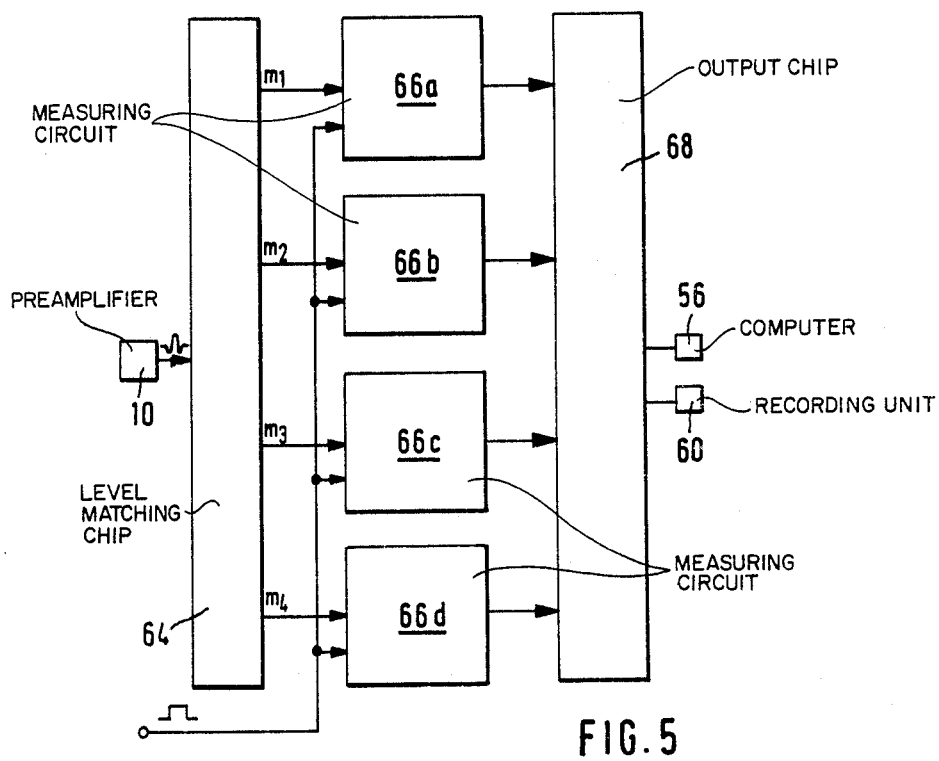
FIG. 5

METHOD FOR DIGITAL PEAK VALUE MEASUREMENT FOR ULTRASONIC TEST PULSES

This is a continuation of application Ser. No. 06/926,891 filed Oct. 31, 1986, abandoned.

The invention relates to a method for digital peak value measurement for ultrasonic test pulses.

BACKGROUND OF THE INVENTION

The invention relates to a method for the digital peak value measurement for ultrasonic test pulses with a predetermined pulse repetition frequency, in which the received signal, after amplification, is present at a comparator circuit the output of which is connected within a predetermined time slot, periodically generated, for the expected signal time range, to a memory which is reset at the beginning of the time slot.

DESCRIPTION OF THE PRIOR ART

Known methods (German patent specification No. 22 26 172 and German Offenlegungsschrift No. 29 39 617) operate in accordance with the parallel method. In this method, the input voltage to be measured is simultaneously applied to n comparators with n different reference voltages. When a predetermined reference voltage is reached, the comparators supply pulses to the subsequent memory. In this arrangement, the stepping of the reference voltage is preferably logarithmic, for example in dB steps.

Devices operating in accordance with the parallel method have the advantage that the measurement value is available in one step. However, their hardware is elaborate since a large number of components must be used which entails a high power consumption. Devices operating in accordance with the parallel method are therefore too expensive for portable test instruments.

In addition, a method is known which operates in accordance with the counting method (German patent specification No. 29 33 070). In this method, a reference voltage supplied via a D/A converter is applied to the comparator. This method is used for representing the entire envelope curve of the echo signal. This method, too, is expensive.

A method is also known for the automatic detection of peak values of an unknown electrical signal (German Offenlegungsschrift No. 32 21 499) which operates by means of a binary search technique, similar to a successive approximation. In this method, a trigger window limits the dynamic range within which input signals can be detected. Within this trigger window, the approximation is carried out by continuous reduction of the differences of successive reference voltage levels. The detected values for positive and negative peaks of a signal are digitally stored in a memory and kept available for the calculation, for example of the 50 % point between the peaks, to generate a trigger level for the stable triggering of an input signal, for example for oscilloscopes or frequency counters. This method is not suitable for measuring ultrasonic test pulses.

SUMMARY OF THE INVENTION

The invention has the object of developing a method of the type initially mentioned in such a manner that it can be easily and inexpensively implemented and can be used both in portable instruments and in relatively large systems and operates within a large dynamic range.

This object is achieved by a method for the digital peak value measurement for ultrasonic test pulses with a predetermined pulse repetition frequency, in which the received signal, after amplification, is present at a comparator circuit the output of which is connected within a predetermined time slot, periodically generated, for the expected signal time range, to a memory which is reset at the beginning of the time slot, wherein the received signal is applied to a window comparator the window width of which corresponds to one voltage step of a reference voltage which is supplied by a D/A converter and which can be changed in steps, the D/A converter is driven by a digital counter the direction of counting of which is controlled in dependence on the memory contents and which is stopped if equality exits between the received signal within the time slot and the respective reference voltage, the display is derived from the final count, and the clock signal for the digital counter has the same frequency as the time slot and is derived from it.

Further features of the invention are described in the following with reference to the drawing.

The method according to the invention differs from the known counting method for analog/digital conversion by the fact that only the maximum crest value is measured within a time slot as a result of which the clock frequency of the system becomes considerably less than the signal frequency. Furthermore, the direction of counting is predetermined for each measurement by the memory contents and, as a result, the total number of slots of the test instrument, necessary for one measurement, is minimized.

BRIEF DESCRIPTION OF THE DRAWING

The invention is illustrated by way of example in the drawings and, in the text which follows, is described in detail with reference to the drawings.

FIG. 4 shows a possible division of the measuring range.

FIG. 5 shows another embodiment of a circuit for carrying out the method.

DETAILED DESCRIPTION OF THE PREFERRED EMBODIMENT

Figure 1:
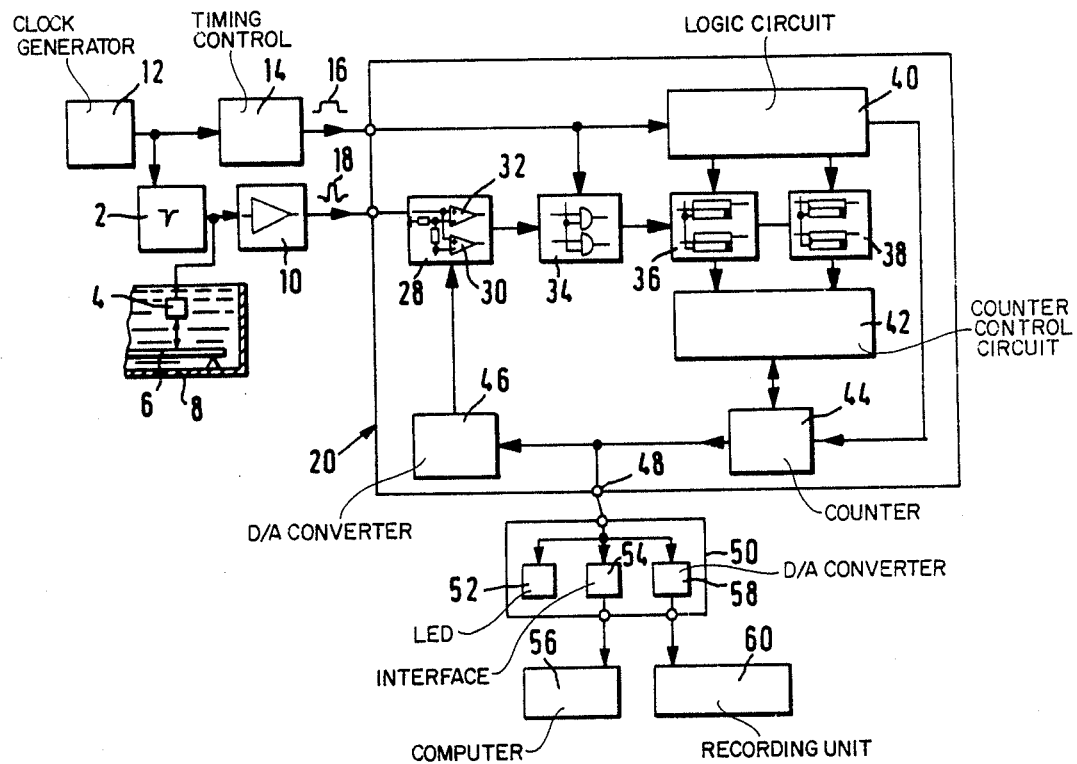
FIG. 1 shows a first embodiment of a circuit for carrying out the method.

In the circuit, shown in FIG. 1 as a block diagram, an ultrasonic transmitter 2 is shown with a test probe 4 which operates at the same time as transmitter and receiver for the test pulses which are emitted by the probe to a workpiece 6 to be tested which is accommodated in the conventional manner in a tank filled with a liquid, in which arrangement the probe 4 is immersed in the liquid. The measured signal received by the probe 4 is applied to a linear preamplifier 10. The ultrasonic transmitter or pulser 2 is driven by a clock generator 12 the trigger pulse of which is at the same time applied to a timing control 14 via which a time slot 16 is generated which delimits the expected signal range and is adjusted, for example, to the range within which a flaw echo is to be expected.

A measuring circuit, represented by the general block 20, for measuring the peak value of the signal 18 is provided for measuring the peak value of the output signal 18 of the preamplifier 10. The time slot 16 is also applied to this measuring circuit.

The output signal of the preamplifier 10 is applied to a comparator chip 28. This comparator chip is designed as a window comparator and has two separate comparators 30, 32 the reference voltages of which differ by one voltage step, in this case for example by 2 dB, as indicated by a fixed voltage divider, drawn in, which is here arranged between the negative inputs of the comparators whilst the output signal of the preamplifier is applied in parallel to the positive inputs of the comparators.

The output signal of the window comparator 28 is applied to a gate circuit 34 which consists, for example, of two parallel AND sections and to which the time slot 16 is applied as second gate signal. The gate circuit can also be integrated in the subsequent memory.

The output signals of the two gates of the gate circuit are applied to a memory 36 which here consists of two flipflops which in each case store the output signal of the two comparators 30, 32 of the window comparator 28. The memory 36 is followed by another memory 38.

A logic circuit 40, controlled by the time slot 16, generates a pulse for transferring the memory contents of memory 36 to memory 38 and for resetting the memory 36. The memories 36 and 38 are connected to a counter control circuit 42. This control circuit controls a digital counter 44 which is clocked by the logic circuit 40. This counter is, for example, a 4-bit binary counter which counts up and down. The counter output is connected to a D/A converter 46 which supplies the stepped reference voltage to the window comparator 28. The reference voltage in the comparator is thus either increased or decreased by one step in dependence on the direction of counting of the counter 44. The counter control circuit 42 determines, in dependence on the ratio between the crest amplitude and the reference voltage, the direction of counting of the counter 44 and stops the counter when the crest amplitude of the signal 18 applied to the window comparator is between the two reference values which are applied to the comparators 32 and 30, that is to say in the comparator window. The output of the counter 44 digitally indicates the respective reference voltage. The respective reference voltage can thus be picked up between the counter 44 and the D/A converter 46 and is available for processing at the output 48 of the circuit 20.

For processing the signal, a chip 50 is shown here in which the digital input signal is reproduced, for example directly, by means of a light-emitting diode display 52. The number of light-emitting diodes can correspond in this case to the number of voltage steps provided and consists, for example, of 16 light-emitting diodes with 16 voltage steps. In the chip 50, an interface 54 is also shown at the output of which, for example, a computer 56 can be connected. In addition, a D/A converter 58 is shown in which the digital signal is converted into an analog signal which can then be recorded as an analog signal, for example, by a recording unit 60 or can also be displayed via an analog display device.

Figure 2:
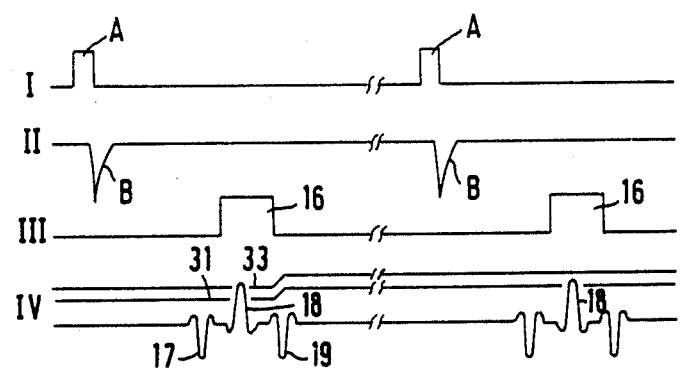
FIG. 2 shows the signal variation in the circuit according to FIG. 1.

FIG. 2 shows the variation with time of the measurement. In the top line I, the trigger pulse A is shown. Its negative edge can be used, for example, for triggering the transmit pulse B shown in Line II. The trigger pulse A also triggers generation of the time slot 16 which is set here for the expected flaw range—line III.

The ultrasonic signal shown in line IV consists of three pulses, namely the entry or surface echo 17, the flaw echo 18 and the back-wall echo 19. The time slot 16 is in this case set in such a manner that only the flaw echo 18 is evaluated. Above line IV, the reference voltages 31, 33 are shown which are different by one reference voltage step x dB and which are present at the two comparators 30, 32 of the window comparator 28. At the end of the time slot, these reference voltages are changed, in this case increased, by one voltage step.

There are three states for the outputs of the two comparators 30 and 32:

1. If the voltage of the peak value of the applied signal 18 is inside the comparator window, that is to say between the reference voltages present at the comparators 30 and 32, only the comparator with the lower reference voltage is triggered. In the memory 36, this sets one of the two flip-flops via the gate 34. In dependence on this, the counter 44 is stopped via the counter control circuit 42 and the ultrasonic transmitter is switched off. The count then digitally indicates the peak value which can be indicated or processed via the chip 50. This state is shown on the right-hand side in FIG. 2.

2. If the peak value is above the comparator window, both comparators 32, 30 are triggered. Both flip-flops are set in the memory 36. This causes the counter control circuit to make the counter 44 count up—left-hand side in FIG. 2. After each slot cycle, the reference voltage is increased by one step until the state described at (1) is obtained.

3. If the peak value is below the comparator window, none of the two comparators is triggered. None of the two flip-flops is set in the memory 36. The counter control 42 causes the counter to count down until the state described in (1) is obtained.

4. The possibility exists that the input signal is outside the measurement range—above or below range. State 1 would then not be achieved. In this case, the counter is stopped at its highest or lowest step and out-of-range is indicated.

The contents of memory 36 are transferred, in each case at the end of the time slot, into the memory 38 following the memory 36, in this case controlled by the negative edge of the time slot. The two memories 36 and 38 can be used for comparing the nth measurement with the (n−1)th measurement. Due to tolerances of the divider resistors built into the window comparator, the width of the window can be less than one voltage step of the D/A converter 46. this would lead to the counter control circuit 42 making the counter 44 continuously count up and down since the peak value, due to the tolerances, is in each case alternately above and below the comparator window. This unstable condition is avoided by comparing the contents of the two memories 36 and 38 in the counter control circuit during two successive measurements. One of the two reference voltages is then used as basis for determining the peak value and inaccuracies in the measurement are not avoidable.

Such an instability can also be avoided by selecting the window width, as the reference voltage stepping of the window comparator, to be greater than one voltage step of the D/A converter 46, in fact by such an amount that the window width corresponds to at least the divider step of the D/A converter 46, even taking into consideration the component tolerances. In general, it is sufficient to provide a window width which is greater by about 5 to 10 % than one voltage step.

The method described is characterized by the fact that only a few critical fast components are needed, namely those of the window comparator 28, of the gate 34 and of the first memory whilst all other components operate with the relatively low frequency clock of the clock generator 12, that is to say the pulse repetition frequency for driving the ultrasonic pulser 2. The cutoff frequency of the instrument is thus determined by the window comparator 28, the signal gate 34 and the first memory unit 36.

By using ECL chips in the window comparator 30, in the signal gate 34 and in the memory 36, the maximum frequency of the ultrasonic pulses can be up to 300 MHz. The other components operating only with the trigger clock can be constructed in TTL techniques.

Figure 3:
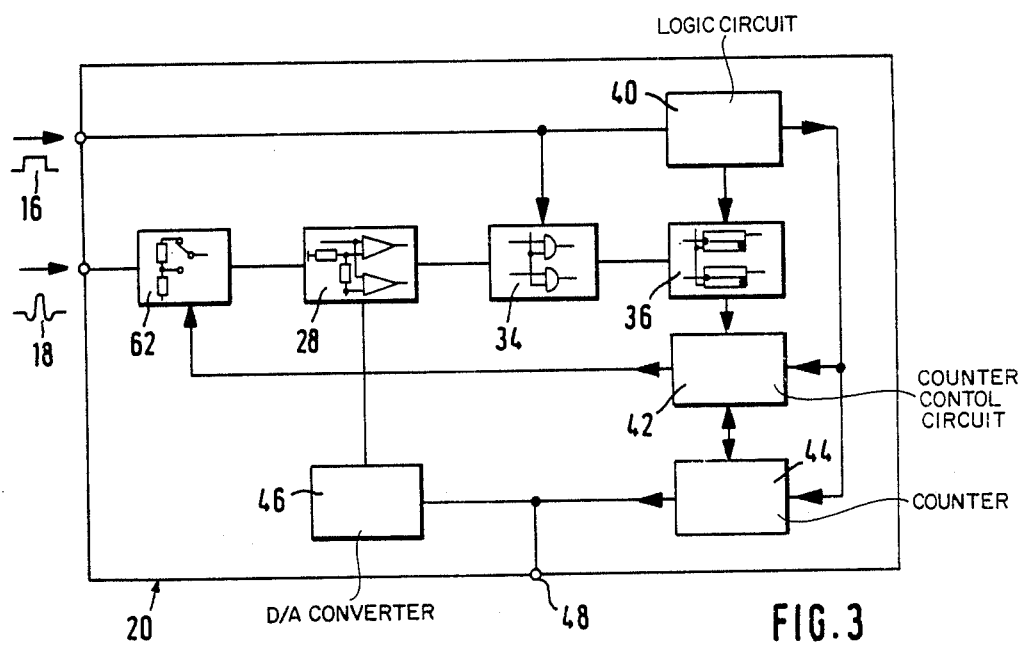
FIG. 3 shows a second embodiment of a circuit for carrying out the method.

The circuit according to FIG. 1 allows a dynamic range of 30 dB to be achieved with a stepping of 2 dB. The dynamic range can be doubled in a simple manner by providing the circuit with an electronically controllable voltage divider or a preamplifier having a switchable gain factor. An appropriately modified embodiment of the measuring circuit 20 is shown in FIG. 3. The same input values as in the embodiment according to FIG. 1 are applied to the circuit. The window comparator 28 is here preceded by an electronically switchable voltage divider 62. The second memory 38 is missing here and the window comparator, as specified above, is constructed with a window which is enlarged by a margin of tolerance compared with the stepping of the reference voltage emitted by the D/A converter 46.

The counter 44 is here constructed as 5-bit binary counter and the D/A converter 46 as a logarithmic 4-bit D/A converter with 1-dB stepping. The electronic change-over switch of the voltage divider 62 is actuated by the counter control circuit 42. A count of 0 dB is allocated to the highest peak value in this case. The divider 62 preceding the window comparator 28 can be electronically switched between 0 dB and −16 dB. An attenuation occurs at the MSB (most significant bit) of the counter=0, that is to say for the reference voltage range of 0 to −15 dB. The peak value amplitudes can thus be compared with the same reference voltages in both measuring ranges.

The measuring speed of the devices described above, that is to say the number of measurements which have to be carried out in the worst case for determining the peak value, is dependent on the number of the reference voltage steps required or provided for the respective measuring problem. In the worst case, (n−1) measurements with measurement value evaluation are needed with n reference voltage steps until the peak value is determined.

A higher measuring speed can be achieved if the dynamic range with n reference voltage steps is subdivided into m ranges with n/m reference voltage steps, in which case m should be greater than n and n should be equal to 3, 4, 5 ....

Such a division of the dynamic range into m ranges is shown in FIG. 4. In line I, the 32 amplitude steps needed for example are shown with 1-dB stepping and a dynamic range of 0 to −31 dB. This total range is here divided into m=4 ranges having 8 reference voltages each. As shown in lines II to V of FIG. 4, range $m_1$ contains steps 0 to −7 dB, range $m_2$ the steps −8 to −15 dB, range $m_3$ t 16 to −23 dB and range $m_4$ the steps −24 to −31 dB.

In this arrangement, each range $m_1$–$m_4$ is associated with one measuring circuit corresponding to the measuring circuit 20 according to FIG. 1 or FIG. 3 which are in each case of identical construction and with which the D/A converter 46 in each case supplies eight reference voltage steps and the counter 44 can be a 3-bit binary counter.

A corresponding circuit is shown in an illustrative embodiment in FIG. 5. The input signal is in this case the output signal of the preamplifier 10, It is here applied, for example, by the preamplifier 10 of a level matching chip 64 in which a level matching operation corresponding to FIG. 4 is performed so that the signal level ranges according to lines II to V of FIG. 4 are in each case present at the four outputs of this chip, that is to say the level ranges $m_1$ to $m_4$. In addition, the slot signal 16 is applied to the individual measuring circuits.

the outputs of the signal levels for ranges $m_1$ to $m_4$ of the matching chip 64 are in each case applied to a measuring circuit 66a to 66d. These measuring circuits 66a to 66d are identical and their output is, for example, in each case the output of the counter 44. These counter outputs are connected to a common output chip 68 which, in principle, can correspond to the chip 50 according to FIG. 1.

Instead of a preceding level matching chip 64, each of the measuring circuits 66a to 66d can be associated with a voltage divider, as in the embodiment of FIG. 3, via which the individual measuring circuits can be adjusted in each case to one of the ranges $m_1$ to $m_4$. Alternatively, each of the measuring circuits 66a and 66d can be associated with one or more amplifiers via which the individual measuring circuits can be adjusted in each case to one of the ranges $m_1$ to $m_4$. The output of the preamplifier 10 could then be directly connected in parallel to the chips 66a to 66d.

The individual measuring circuits 66a to 66d operate in the manner described above. Since each circuit is associated with a particular dynamic range, the peak value is determined in the circuit within whose dynamic range the peak value is located. As soon as the peak value is found in one of the circuits due to the fact that the crest value is located within the comparator window, the count present at the output chip 68 is multiplied in this chip by a factor associated with the respective dynamic range and is then output as a digital or analog crest value.

In the case of m ranges with n reference voltage steps in each of the ranges, the peak value is thus available after a maximum of (n−1) ultrasonic measuring pulses.

Transgressions above or below range are determined by means of chips 66a or 66d in conjunction with the output chip.

The above description relates to measuring a positive peak value. Inverse peak voltages can also be measured by generating an inverse reference voltage in conjunction with a corresponding circuit for the comparators of the window comparator. Another possibility for this is offered, for example, by a preamplifier which can be switched to invert.

We claim:

1. A method for measuring digital peak values of ultrasonic test pulses which comprises:
   operating within a high dynamic range with a predetermined pulse repetition frequency;
   applying, after linear amplification, a received signal to a measuring circuit having a window comparator circuit with two comparators;
   supplying a reference voltage stepwise by means of a D/A-converter to the window comparator circuit;
   forming a window with the two comparators, the window having a window width within a range of 105 to 110% of one voltage step of the stepwise reference voltage;

periodically generating for an expected signal range a predetermined time slot;

connecting the output of the window comparator to a memory means during the predetermined time slot, the memory means having bistable memory units for connecting each output of the two comparators;

resetting the memory means at the beginning of the predetermined time slot;

driving the D/A-converter with a digital counter which is clocked with a clock signal having the same frequency as the predetermined time slot, wherein the clock signal being derived from the predetermined time slot;

controlling the direction of counting of the digital counter with the actual status of the bistable memory units connected to each of the comparators by setting the respective bistable memory unit if the comparators are triggered, and stopping the digital counter if the voltage of a peak value of the received signal is within the window formed by the two comparators; and processing a digital signal of a final count from the digital counter to provide a data output representing the measured digital peak value of the ultrasonic test pulses.

2. A method as claimed in claim 1, wherein a logarithmic D/A converter is used for generating the reference voltage.

3. A method as claimed in claim 1, wherein the digital signal of the digital counter is transferred to a second D/A converter for providing analog data output.

4. A method as claimed in claim 1, wherein the received amplified signal is applicable to the window comparator circuit with at least two different signal levels.

5. A method as claimed in claim 4, wherein the different signal levels are generated by means of voltage dividers.

6. A method as claimed in claim 4, wherein the received signal is initially applied to a plurality of parallel amplifiers with different gain factors.

7. A method as claimed in claim 1, wherein the counter is stopped at its highest or lowest step in the case of signal voltages which are above or below the dynamic range, and an above- or below-range indication is triggered.

8. A method as claimed in claim 1, wherein the received signal may be associated with one of at least two different signal rangers, each of which is associated with an equal part of the total number of reference voltage steps of the whole dynamic range, which parts correspond to the total number of reference voltage steps divided by the number of different signal levels, and wherein the received signal associated with each of its different signal ranges is applied to a separate measuring circuit and the outputs of the digital counter of each of the measuring circuits are connected to a processing circuit, in which the final count is multiplied by a factor depending on the signal level applied to the measuring circuit by which the final count has been issued.

* * * * *